United States Patent [19]

Schnur

[11] Patent Number: 4,992,737
[45] Date of Patent: Feb. 12, 1991

[54] SAMPLE HEAD FOR NMR TOMOGRAPHY

[75] Inventor: Günter Schnur, Ulm-Lehr, Fed. Rep. of Germany

[73] Assignee: Bruker Medizintechnik GmbH, Fed. Rep. of Germany

[21] Appl. No.: 436,487

[22] Filed: Nov. 14, 1989

[30] Foreign Application Priority Data

Nov. 18, 1988 [DE] Fed. Rep. of Germany ....... 3839046

[51] Int. Cl.$^5$ ............................................. G01R 33/30
[52] U.S. Cl. .................................. 324/318; 333/223; 333/235
[58] Field of Search ............... 324/300, 307, 316, 318, 324/322; 333/219, 223, 231, 225

[56] References Cited

U.S. PATENT DOCUMENTS

| | | | |
|---|---|---|---|
| 4,751,464 | 6/1988 | Bridges | 324/318 |
| 4,769,602 | 9/1988 | Vinegar et al. | 324/307 |
| 4,799,016 | 1/1989 | Rezvani | 324/318 |
| 4,845,431 | 7/1989 | Sullenberger | 324/318 |

FOREIGN PATENT DOCUMENTS 3237250 10/1982 Fed. Rep. of Germany.
3522401 6/1985 Fed. Rep. of Germany.

OTHER PUBLICATIONS

Purcell, "Aufbau und Eigenschaften...", Bauelemente der Elektrotechnik, vol. 4, 1969, pp. 13-15.
Egerton et al., "Preparation of High Density Ceramic...", Ceramic Bulletin, vol. 50, No. 11, 1971, pp. 924-928.

Primary Examiner—Michael J. Tokar
Assistant Examiner—Kevin D. O'Shea
Attorney, Agent, or Firm—Harness, Dickey & Pierce

[57] ABSTRACT

A sample head (1) with cage resonator includes an insert (51) which can be introduced into the cavity formed by the conductor sections (22) of the cage conductor and which increases the electric length of the cage resonator in such a manner that the cage resonator containing the insert assumes a resonant state at a second predetermined operating frequency $f_1$, whereas without the insert introduced, it is resonant at a first predetermined operating frequency $f_0$. By introducing or withdrawing the insert (51), it is therefore possible to operate a sample head of this type selectively with two different frequencies corresponding to the resonance frequencies of different nuclear species, for example the proton and the fluorine resonance.

7 Claims, 1 Drawing Sheet

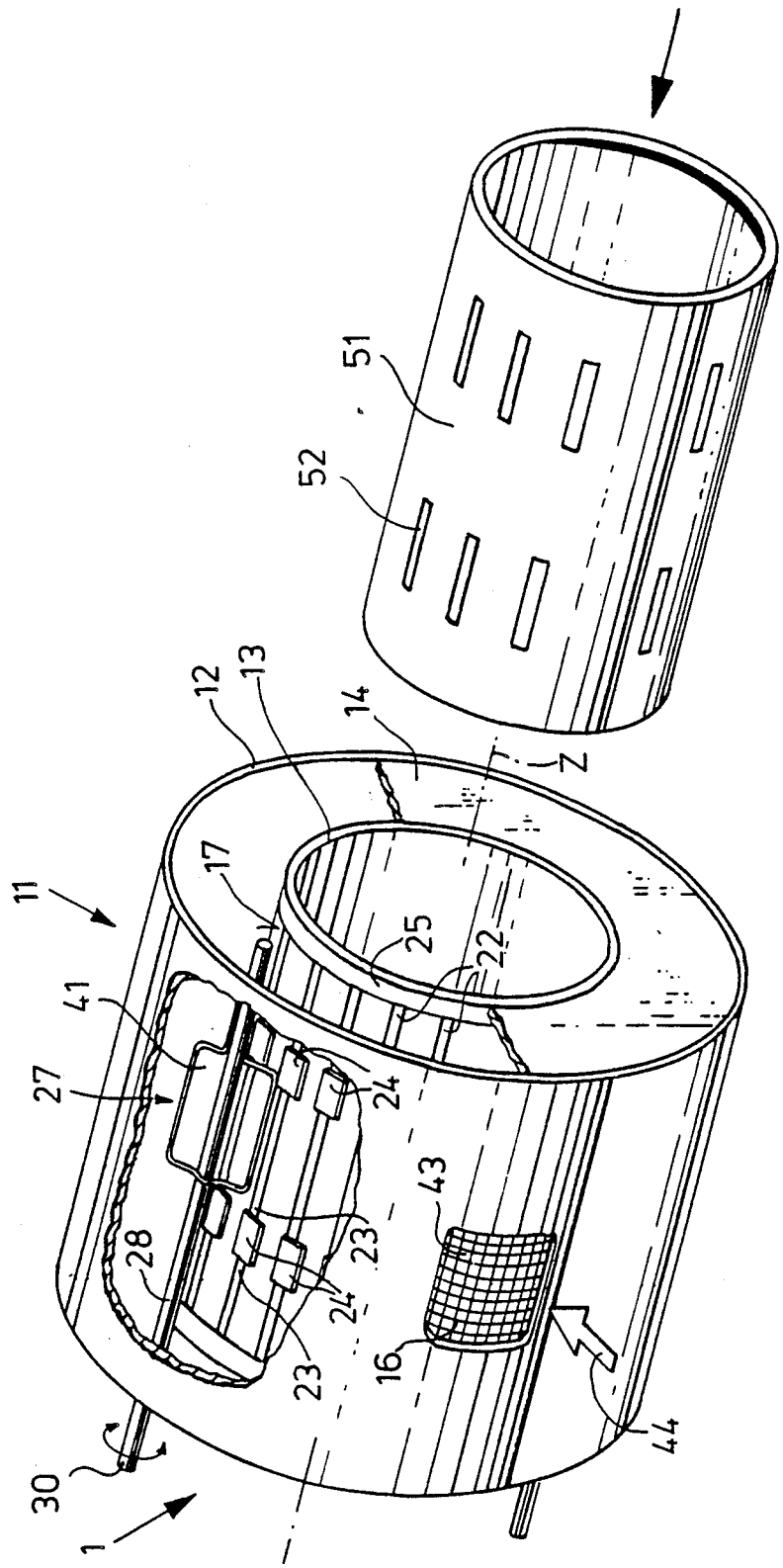

SAMPLE HEAD FOR NMR TOMOGRAPHY

BACKGROUND OF THE INVENTION

The present invention relates to a sample head for NMR tomography having a cage resonator comprising a number of conductor sections arranged on a cylinder surface and directed in parallel to the cylinder axis, electrically conductive screening means enclosing the conductor sections and arranged concentrically relative to the cylinder surface, and capacitors connected in series to the conductor sections which, together with the conductor sections, define the electric length of the cage resonator in such a manner that the cage resonator is resonant at a first, predetermined operating frequency $f_0$, and having further means for exciting a TEM dipole wave in the cage resonator.

Different designs of such sample heads have been previously known, for example from DE- A 35 22 401 and EP-A 141 383. In the first case, the conductor sections extend over the full length of the cage resonator, and the capacitors are arranged between the ends of the conductor sections and the electrically conductive screening. In the latter case, a plurality of conductor sections is arranged axially behind each other and interconnected by the capacitors. In addition, the ends of the conductor sections are all interconnected by an annular conductor section.

In order to achieve a good signal-to-noise ratio, it is desirable that these cage resonators should have the highest possible quality (Q) and, accordingly, pronounced resonance. Consequently, they must be tuned to the operating frequency $f_0$. In the case of the sample head known from DE-A 35 22 401, such tuning is effected by means of a tubular, electrically conductive section which is inserted into the one end of the cylinder formed by the conductor sections. This permits a tuning adjustment of the resonance frequency by a maximum of 3%. In the case of the sample head known from EP-A 141 383, one of the capacitors connected in series to the conductor sections is designed as a tunable capacitor permitting sharp tuning. However, such tuning must be effected in a separate test circuit, before installation of the test head.

The required sharp tuning of the sample head to the operating frequency has the result that each sample head is adjusted only to one such operating frequency, the latter resulting from the resonance frequency of the nuclear species to be observed, which resonance frequency is a function of the nuclear species as such and the magnetic field prevailing at the measuring point. In NMR tomography, one usually observes proton spins, and the magnetic field is selected in such a manner that the resonance frequency of the proton spins is either 100 MHz or 200 MHz.

However, in addition to observations of the density of proton spins, which is characteristic in particular for the distribution of water in examinations of biological tissue, observations of spins of other nuclear species, such as deuterium, carbon 13, phosphorus, fluorine, etc., are also of interest in NMR tomography. A field of particular interest is the observation of fluorine resonance which has a frequency lower by approximately 6% than the resonance frequency of protons. In practice, fluorine resonance observations are connected with considerable difficulties because the sample head, which is normally tuned to the resonance of proton, is not suited, for the reasons outlined above, for observations of the resonance of fluorine so that it has to be exchanged against a sample head especially tuned to the resonance of fluorine. However, the labor input required in this connection is so important that it practically prohibits the frequent exchange of the sample heads which would be required for carrying out successive proton and fluorine measurements on the same object.

SUMMARY OF THE INVENTION

Now, it is the object of the present invention to improve a sample head of the type described above in such a manner that its resonance frequency can be tuned easily to the resonance frequencies of different nuclear species so as to permit observations of the resonances of different nuclear species in successive measurements carried out on the same object.

This object is achieved according to the invention by the fact that the coil arrangement comprises an insert designed as a hollow cylinder permeable for the electromagnetic rf field and adapted for being introduced into the cavity formed by the conductor sections, and that the insert, when fitted in the cavity formed by the conductor sections in a predetermined position, increases the electric length of the cage resonator to a value such that the cage resonator is resonant at a second predetermined operating frequency $f_1$.

Although, as has been described above, the known sample heads are provided already with, substantially, capacitive means for adjusting the resonance frequency of the cage resonator to a predetermined value, these means are exclusively designed as adjusting means intended for adjusting precisely the design resonance frequency of the sample head and permitting at best sharp tuning in response to the loading of the sample head by the sample to be tested. In contrast, the insert according to the invention is no adjusting means, but rather a switching means permitting the operating frequency to be switched over from a first value $f_0$ to a second value $f_1$, and vice versa. The usual adjusting means for tuning the resonance frequency of the cage resonator to the operating frequency $f_0$ are still required, also for the test head according to the invention, and further adjusting means are needed to ensure that after insertion of the insert the resonance frequency of the test head conforms exactly with the second predetermined operating frequency $f_1$, even though the adjustment of the second operating frequency may be influenced by the position of the insert relative to the cage resonator of the sample head. The invention, therefore, provides a sample head having two predetermined resonance frequencies to which it can be switched over by introducing or withdrawing an insert. Both the introduction and the withdrawal of the insert are very simple, quick measures which, far from requiring the removal of the sample head, do not even require the removal of a sample present in the sample head. This allows the operating frequency required for observing different nuclear species to be changed at any time during examination of an object so that the invention contributes towards extending considerably the scope of results achievable in practice by NMR tomography.

The insert serving for varying the operating frequency may consist of a material having a high dielectric constant, for example a ceramic material on BaTi and/or $TiO_2$ basis. The electromagnetic waves propagating in the cage resonator along the conductive sections show reduced propagation speed in materials having a high dielectric constant, which corresponds to a reduction of the effective wave length so that the resonance is shifted towards increased wave lengths, i.e. a lower frequency. Compared with an insert whose component shifting the resonance frequency consists practically exclusively of a dielectric material, greater effects are achieved by the use of an insert comprising a dielectric carrier carrying electrically conductive sections closely adjoining the ends of the electrically conductive conductor sections to which the capacitors of the cage resonator are connected, thus increasing the capacitance formed by these capacitors, for lowering the resonance frequency of the cage resonator. It is possible in this manner to achieve very considerable variations of the resonance frequency of the cage resonator, and as the resonance frequency will be influenced relatively considerably by axial displacements just as by rotary displacements of the insert, it is rendered possible at the same time to define the second resonance frequency $f_1$ very precisely by appropriate selection of the axial position of the insert. As has been mentioned before, the first operating frequency $f_0$ may be the proton resonance frequency, and the second operating frequency $f_1$ may be the fluorine resonance frequency.

According to a preferred embodiment of the invention, the conductor sections arranged on a cylinder surface are subdivided to groups of three sections of substantially identical length which are arranged behind each other in the axial direction. The ends of these sections face each other, at a small spacing, and the capacitors of the cage resonator are connected to these ends. The outer ends of the outermost conductor sections of each group are interconnected by an annular conductor section. Finally, electrically conductive sections are arranged on the dielectric carrier of the insert in a manner to overlap the oppositely arranged ends of the conductor sections following each other in the axial direction. This design of the sample head has been found to be extremely easy to produce and safe in operation, and enables further the resonance frequency to be varied within very broad limits, by varying the capacitance between the conductor sections following each other in the axial direction without, however, leading to a loss in quality of the sample head which would make itself felt notably in tomographic measuring practice.

The invention will now be described and explained in more detail with reference to the embodiment illustrated in the drawing. The features that can be derived from the specification and the drawing may be used in other embodiments of the invention either alone or in any combination thereof.

BRIEF DESCRIPTION OF THE DRAWING The drawing shows a perspective view, partly broken away, of the sample head according to the invention, in combination with an associated insert.

DESCRIPTION OF THE PREFERRED EMBODIMENT

The sample head 1 shown in the drawing comprises a hollow-cylindrical housing 11 consisting of a jacket 12, an inner tube 13 and annular end disks 14 bridging the space between the jacket 12 and the inner tube 13. The inner surface of the jacket 12 is rendered electrically conductive, for example lined with a metal grid 16. The outer surface 17 of the inner tube 13 carries conductor sections 22 extending in parallel to the axis z of the housing 11 and, accordingly, also to the inner tube 13 and arranged in groups of three sections 22 which follow each other in the longitudinal direction of the inner tube 13. The conductor sections 22 have all the same length; their oppositely arranged ends 23 are interconnected by a capacitor 24. In addition, the ends of the outer conductor sections, which extend right to the ends of the inner tube 13, are interconnected by an annular conductor section 25.

In order to couple electric energy into the sample head 1, coupling arrangements are provided at two opposite points of the sample head. In the drawing, one can see only one of the coupling arrangements 27, i.e. the one located in the upper portion of the sample head, where the jacket 12 has been partially broken away. For adjusting the coupling arrangement 27, there is provided a rod 28 passing through the space 15 in parallel to the axis z. One end of the rod 28 is provided with a handle 30, by means of which the rod can be turned about its longitudinal axis in the direction indicated by the double arrow. The opposite end of the rod 28 is seated in a bearing mounted in the opposite end disk 14. The bearings may at the same time serve for establishing an electrically conductive connection to a loop antenna 41 arranged at the axial center of the rod 28.

Finally, an observation opening 43 is arranged in the jacket 12, through which the metal grid 16 can be seen and which provides a view of the interior of the sample head and also of the sample space enclosed by the inner tube 13.

The described arrangement is a so-called cage resonator. It is a characteristic feature of all cage resonators that only axial currents are allowed to flow along the resonator wall formed by the inner tube 13 with the axially directed conductor sections 22. Consequently, a TEM wave and, in the case of appropriate exitation by means of the coupling arrangement 27, a so-called TEM dipole wave, develops in such a cage resistor. In the case of this wave type, two points arranged diametrically opposite each other on the circumference of the inner tube 13 exist where the amount of the axial current is equal to zero. These points are located in a plane extending perpendicularly to the plane defined by the two coupling arrangements 27 which are likewise arranged diametrically opposite each other.

The conductor sections 22 are distributed over the periphery of the inner tube 13 at a spacing n/8 so that it would be possible to provide 16 such conductors. However, of these 16 possible axial conductor sections, one conductor section has been omitted at each of the points where practically no current flows so that a total of 14 such conductors is provided. The respective points of the jacket 12 are provided with observation openings 43 which provide a view of the interior of the sample head, in the direction of arrow 44. The capacitors 24 arranged between the conductor sections 22 are adjustable as regards the tuning control and enable the resonance frequency of the described cage resonator to be adjusted to a first operating frequency $f_0$, at which the static magnetic field generated by the NMR tomograph is equal to the proton resonance frequency. This resonance frequency typically has the value of $f_0 = 200$ MHz. This resonance frequency is achieved with the aid of an arrangement where the inner tube 13 has an outer diameter of 150 mm and a length of 234 mm. Each of the conductor sections has a length of 60 mm and a width of 5 mm. The interconnecting capacitors have a capacitance of approximately 9 pF. The annular conductor sections 25 interconnecting the outer ends of the conductor sections 22 have a width of 8 mm at the one end of the inner tube 13 and a width of 18 mm at their other end. Their spacing from the end of the inner tube 13 is 5 or 2 mm, respectively.

For varying the operating frequency of the sample head 1, there is provided a tubular insert 51 whose outer diameter corresponds to the inner diameter of the inner tube 13 and which has approximately the same length as the inner tube. Like the inner tube, it also consists of an insulating material, for example plexiglass (PMMA) or a fiber-reinforced plastic material, and is provided on its outer face with electrically conductive sections 52 distributed over the circumference of the insert 51 at the same angular spacing at which the axial conductor sections 22 are distributed over the circumference of the inner tube 13. The axial position of the conductive sections 52 on the tubular insert 51 is selected in such a manner that these sections 52 bridge the gaps existing between the axially adjacent conductor sections 52, thereby providing an additional capacitive coupling between the conductor sections arranged axially behind each other. This increases the coupling effected by the capacitors 24 between the conductor sections arranged axially behind each other, which increase corresponds to an extension of the line formed by these conductor sections and, accordingly, to a corresponding decrease of the resonance frequency. By using conductive sections 52 having a length of approximately 44 mm and a width of 12.5 mm, the resonance frequency can be reduced by 6% to $f_1 = 188$ MHz and, accordingly, to the resonance of fluorine. It is easily understood in this connection that the exact value of the resonance frequency $f_1$ is a function of the position of the conductive sections 25 arranged on the insert, with respect to the gaps between the conductor sections 22 arranged axially behind each other so that exact tuning to the desired second operating frequency $f_1$ can be achieved by varying the angular position and/or the axial position of the insert. Once the correct position of the insert 51 has been found, it can be fixed by means of suitable stops and/or other register means - not shown in detail - ensuring that the insert 51 will always exactly occupy the position in which the sample head is exactly tuned to the desired second operating frequency $f_1$.

It will be understood that the embodiment illustrated in the drawing represents a sample head for use in NMR tomography, which can be switched over, by inserting the insert 51, from a first operating frequency $f_1$, amounting to 200 MHz and corresponding to the proton resonance, to a second operating frequency $f_1$, which amounts to 188 MHz and corresponds to the resonance of fluorine. This variation of the operating frequency is effected by inserting the insert 51, just as switching back to the first operating frequency $f_0$ may be effected simply by withdrawing the insert. The illustrated sample head, therefore, provides the possibility to effect, in direct succession with one and the same NMR tomography unit, measurements enabling images to be obtained of the distribution of the proton density on the one hand and the distribution of the fluorine density on the other hand, or of the volume-selective spectra of the said nuclear species in the object under examination.

It goes without saying that the invention is not limited to the illustrated embodiment, but that deviations are possible without leaving the scope of the invention. Basically, the invention is independent of the particular design of the cage resonator, it being of importance only that the length of the cage resonator is increased by the use of an insert to such a value that the cage resonator assumes the resonant state at a second predetermined operating frequency $f_1$. This may be achieved on the one hand by increasing the capacitive loading of the lines formed by the conductor sections of the cage resonator, or on the other hand by increasing the series inductivity of these conductors by any suitable measures. Generally, all measures may be convenient whose effect may be described as effective extension of the line or as reduction of the effective wave length. Such measures may include, for example, the use of a cylindrical insert 51, which need not be provided with conductive sections, because its dielectric constant is high enough to ensure that the propagation speed of the electromagnetic waves which depends on the dielectric constants of the agent surrounding the axial line sections and, accordingly, the effective wave length, are reduced sufficiently to provoke a resonant state at the desired lower operating frequency $f_1$. For a frequency difference of 6%, as it exists between the frequencies of the proton resonance and the fluorine resonance, an insert having a dielectric constant in the range of between 30 and 40 is needed. Materials offering sufficiently high dielectric constants and small loss factors are, for example, ceramic materials on a barium titanate and titanium dioxide basis.

Finally, it should be noted that measurements on a sample head according to the embodiment described with reference to the drawing, and designed according to the invention, have shown that insertion of the insert does not lead to a measurable variation in field homogeneity within the sample head. While the introduction of the insert leads to a considerable reduction in quality of the empty sample head, this is in fact no notable disadvantage because the reduction in quality of a sample head loaded by a sample of usual size resulting from the introduction of the insert remains below negligible limits. The measurements performed on the sample head, with and without the insert, and the images obtained by evaluating these measurements are, therefore, comparable in ever respect.

The reference numerals mentioned in the claims are not meant to restrict the scope thereof, but are intended only to facilitate their understanding.

I claim:

1. Sample head for NMR tomography having a cage resonator comprising a number of conductor sections arranged on a cylinder surface and directed in parallel to the cylinder axis, electrically conductive screening means enclosing the conductor sections and arranged concentrically relative to the said cylinder surface, and capacitors connected in series to the said conductor sections which, together with the conductor sections, define the electric length of the cage resonator in such a manner that the cage resonator is resonant at a first, predetermined operating frequency $f_0$, and having further means for exciting a TEM dipole wave in the cage resonator, characterized in that said sample head (1) comprises an insert (51) designed as a hollow cylinder which is permeable for the electromagnetic rf field and which, when occupying a predetermined position in the cavity formed by said conductor sections (22), increases the electric length of the cage resonator to a value such that the cage resonator is resonant at a second predetermined operating frequency $f_1$.

2. Sample head according to claim 1, characterized in that
said insert consists of a material having a high dielectric constant.

3. Sample head according to claim 2, characterized in that
said insert consists of a ceramic material on the basis of at least one of the substances BaTi and $TiO_2$.

4. Sample head according to claim 1, characterized in that
said insert (51) comprises a dielectric carrier carrying electrically conductive sections (52) arranged opposite the ends (23) of said electrically conductive sections (22), to which the capacitors (24) of the cage resonator are connected, at a small spacing, thus increasing the capacitance produced by said capacitors (24), for decreasing the resonance frequency of said cage resonator.

5. Sample head according to claim 1, characterized in that the first operating frequency $f_0$ is that of the proton resonance, while the second operating frequency $f_1$ is that of the fluorine resonance.

6. Sample head according to claim 4, characterized in that
said conductive sections (22) arranged on said cylinder surface (16) are subdivided to groups of three sections of substantially identical length which are arranged behind each other in the axial direction and that the ends (23) of these sections face each other, at a small spacing, and the capacitors (24) of said cage resonator are connected to these ends, while the outer ends of the outermost conductor sections of each group are interconnected by an annular conductor section (25), and that electrically conductive sections (52) overlap the oppositely arranged ends (23) of said conductor sections (22) arranged behind each other.

7. Sample head according to claim 6, characterized in that the first operating frequency $f_0$ is that of the proton resonance, while the second operating frequency $f_1$ is that of the fluorine resonance.

* * * * *